(12) United States Patent
Jeon

(10) Patent No.: US 10,069,107 B2
(45) Date of Patent: Sep. 4, 2018

(54) FLEXIBLE DISPLAY DEVICES

(71) Applicant: Samsung Display Co., Ltd., Yongin-si, Gyeonggi-do (KR)

(72) Inventor: Hee-Chul Jeon, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/064,364

(22) Filed: Mar. 8, 2016

(65) Prior Publication Data

US 2017/0054106 A1 Feb. 23, 2017

(30) Foreign Application Priority Data

Aug. 17, 2015 (KR) .................. 10-2015-0115629

(51) Int. Cl.
| | |
|---|---|
| *H01L 29/08* | (2006.01) |
| *H01L 51/52* | (2006.01) |
| *H01L 51/00* | (2006.01) |
| *H01L 27/32* | (2006.01) |
| *H01L 29/66* | (2006.01) |
| *H01L 27/12* | (2006.01) |

(52) U.S. Cl.
CPC ...... *H01L 51/5253* (2013.01); *H01L 51/0097* (2013.01); *H01L 27/12* (2013.01); *H01L 27/3244* (2013.01); *H01L 29/66757* (2013.01); *H01L 51/5246* (2013.01); *H01L 51/5259* (2013.01); *H01L 2251/5338* (2013.01); *Y02E 10/549* (2013.01)

(58) Field of Classification Search
CPC ............ H01L 51/5253; H01L 27/3244; H01L 51/0097; H01L 51/3257; H01L 51/5256; H01L 51/5246; H01L 51/5259

USPC ........ 257/40, 59, 72, 98, 99; 438/82, 99, 48, 438/128
See application file for complete search history.

(56) References Cited

U.S. PATENT DOCUMENTS

| | | | |
|---|---|---|---|
| 7,612,498 B2 * | 11/2009 | Sano ................... | H01L 51/5256 313/506 |
| 9,274,559 B2 | 3/2016 | Prushinskiy et al. | |
| 9,515,099 B2 * | 12/2016 | Kwon ................. | H01L 27/1244 |
| 2002/0140347 A1 * | 10/2002 | Weaver ................ | H01L 25/047 313/506 |
| 2003/0205845 A1 * | 11/2003 | Pichler ................ | H01L 51/5253 264/272.11 |
| 2005/0017633 A1 * | 1/2005 | Miyadera ............... | H05B 33/04 313/512 |
| 2005/0156513 A1 * | 7/2005 | Sano ................... | H01L 51/5256 313/504 |

(Continued)

FOREIGN PATENT DOCUMENTS

| | | |
|---|---|---|
| KR | 10-2007-0016772 A | 2/2007 |
| KR | 10-2013-0132438 A | 12/2013 |

*Primary Examiner* — Thinh T Nguyen
(74) *Attorney, Agent, or Firm* — Knobbe, Martens, Olson & Bear, LLP

(57) ABSTRACT

A flexible display device is disclosed. In one aspect, the flexible display device includes a display panel having a flat region, a boundary region, and a bending region. The flexible display device also includes a protective structure having a first portion formed under the flat region and a second portion formed under the boundary region. A thickness of the first portion is substantially uniform. A thickness of the second portion decreases along a direction from the flat region toward the bending region.

16 Claims, 5 Drawing Sheets

(56) References Cited

U.S. PATENT DOCUMENTS

| | | | |
|---|---|---|---|
| 2009/0267487 A1* | 10/2009 | Kwack | H01L 51/5259 313/503 |
| 2014/0042406 A1 | 2/2014 | Degner et al. | |
| 2014/0098549 A1 | 4/2014 | Hack et al. | |
| 2015/0277496 A1* | 10/2015 | Reeves | G06F 1/1641 345/1.2 |
| 2016/0035759 A1* | 2/2016 | Kwon | H01L 27/1244 257/40 |
| 2016/0147362 A1* | 5/2016 | Eim | G06F 1/1641 345/173 |

* cited by examiner

FLEXIBLE DISPLAY DEVICES

CROSS-REFERENCE TO RELATED APPLICATION(S)

This application claims priority under 35 USC § 119 to Korean Patent Application No. 10-2015-0115629, filed on Aug. 17, 2015 in the Korean Intellectual Property Office (KIPO), the entire disclosure of which is incorporated by reference herein.

BACKGROUND

Field

The described technology generally relates to a display devices, and more particularly, to flexible display devices.

Description of the Related Technology

Recently, flexible display devices have been developed to be bendable, rollable, and/or foldable. They include a flexible display panel formed of a material that is light, durable, and flexible. Flexible display devices can be incorporated into electrical/electronic devices including as a component of articles of clothing and printed media.

A protective structure is typically formed under the flexible display panel. The protective structure can protect the flexible display panel from wear and tear due to interactions with the environment.

However, when a protective structure is attached to the bottom of the flexible display panel, the overall thickness of the flexible display device increases. This can cause an increase in stress generated in the flexible display panel, leading to damage such as cracks in the flexible display panel or the protective structure being detached from the flexible display panel.

SUMMARY OF CERTAIN INVENTIVE ASPECTS

One inventive aspect is a flexible display device including a protective structure for dispersing stress generated in a display panel.

Another aspect is a flexible display device including a dispersive structure for dispersing stress generated in a display panel.

Another aspect is a flexible display device including a display panel having a plane region, a boundary region and a bending region, and a protective structure having a first portion formed under the plane region and a second portion formed under the boundary region. A thickness of the first portion can be substantially uniform, and a thickness of the second portion can decrease in a direction from the plane region toward the bending region.

In example embodiments, the thickness of the second portion can linearly decrease in the direction from the plane region toward the bending region.

In some example embodiments, the thickness of the second portion can decrease in a stepped manner in the direction from the plane region toward the bending region.

In some example embodiments, the protective structure can include a plurality of stacked films that each has a different width.

In some example embodiments, thicknesses of the plurality of films can be substantially the same as each other.

In some example embodiments, widths of the plurality of films can decrease by a substantially equal amount in a direction from an uppermost layer toward a lowermost layer.

In some example embodiments, the second portion of the protective structure can include a plurality of holes, and depths of the plurality of holes can increase in the direction from the plane region toward the bending region.

In some example embodiments, horizontal distances between the plurality of holes can be substantially the same as each other.

In some example embodiments, the depths of the plurality of holes can increase by a substantially equal amount in the direction from the plane region toward the bending region.

In example embodiments, the bending region can be located at a center of the display panel, and the plane region can be located at a right side and/or a left side of the bending region.

In some example embodiments, the plane region can be located at a center of the display panel, and the bending region can be located at a right side and/or a left side of the plane region.

In example embodiments, the protective structure can include at least one of the following materials: polyethylene (PE), polyethylene terephthalate (PET), polyethylene naphthalate (PEN), polyethylene sulfide (PES), polypropylene (PP), and polycarbonate (PC).

In example embodiments, the display panel can include a flexible substrate formed on the protective structure, an organic light-emitting structure formed on the flexible substrate, and an encapsulation layer formed on the organic light-emitting structure.

In some example embodiments, the flexible display device can further comprise an adhesive layer interposed between the display panel and the protective structure.

In some example embodiments, the adhesive layer can include acryl-based resin.

According to example embodiments, a flexible display device can include a display panel having a plane region, a boundary region and a bending region, a protective structure formed under the plane region, and a dispersive structure formed under the boundary region. A thickness of the protective structure can be substantially uniform, and a thickness of the dispersive structure can decrease in a direction from the plane region toward the bending region.

In example embodiments, the thickness of the dispersive structure can linearly decrease in the direction from the plane region toward the bending region.

In example embodiments, the protective structure can include at least one of the following materials: polyethylene, polyethylene terephthalate, polyethylene naphthalate, polyethylene sulfide, polypropylene, and polycarbonate.

In example embodiments, the dispersive structure can include at least one of the following materials: UV epoxy-based resin, urethane acrylate-based resin, and acrylate-based resin.

In example embodiments, the bending region can be located at a center of the display panel, and the plane region can be located at a right side and/or a left side of the bending region.

Another aspect is a flexible display device including a display panel having a flat region, a boundary region, and a bending region; and a protective structure having a first portion formed under the flat region and a second portion formed under the boundary region, wherein the thickness of the first portion is substantially uniform, and wherein the thickness of the second portion decreases along a direction from the flat region toward the bending region.

In example embodiments, the thickness of the second portion linearly decreases along the direction from the flat region toward the bending region. The thickness of the second portion can decrease in a stepped manner along the direction from the flat region toward the bending region. The protective structure can include a plurality of stacked films each having a different width. The thicknesses of the films can be substantially the same.

In example embodiments, the widths of the films decrease by a substantially equal amount along a direction from an uppermost layer of the films toward a lowermost layer of the films. The second portion of the protective structure can include a plurality of holes and depths of the holes can increase along the direction from the flat region toward the bending region. Horizontal distances between the holes can be substantially the same.

In example embodiments, the depths of the holes increase by a substantially equal amount along the direction from the flat region toward the bending region. The bending region can be located at the center of the display panel and the flat region can be located at a right side and/or a left side of the bending region. The flat region can be located at the center of the display panel and the bending region can be located at a side of the flat region.

In example embodiments, the protective structure is formed of at least one of the following materials: polyethylene (PE), polyethylene terephthalate (PET), polyethylene naphthalate (PEN), polyethylene sulfide (PES), polypropylene (PP), and polycarbonate (PC). The display panel can include a flexible substrate formed over the protective structure, an organic light-emitting diode (OLED) structure formed over the flexible substrate, and an encapsulation layer formed over the OLED.

In example embodiments, the flexible display device further comprises an adhesive layer interposed between the display panel and the protective structure. The adhesive layer can be formed of an acryl-based resin.

Another aspect is a flexible display device including a display panel having a flat region, a boundary region, and a bending region; a protective structure formed under the flat region; and a dispersive structure formed under the boundary region, wherein a thickness of the protective structure is substantially uniform, and wherein a thickness of the dispersive structure decreases along a direction from the flat region toward the bending region.

In example embodiments, the thickness of the dispersive structure linearly decreases along the direction from the flat region toward the bending region. The protective structure can be formed of at least one of the following materials: polyethylene, polyethylene terephthalate, polyethylene naphthalate, polyethylene sulfide, polypropylene, and polycarbonate. The dispersive structure can be formed of at least one of the following materials: UV epoxy-based resin, urethane acrylate-based resin, and acrylate-based resin. The bending region can be located at the center of the display panel and wherein the flat region is located at a side of the bending region.

According to example embodiments, the flexible display device can include the protective structure having the second portion under the boundary region, and the thickness of the second portion can substantially decrease in the direction from the plane region toward the bending region. Therefore, the stress generated from the display panel can be dispersed, and damage such as crack between the plane region and the bending region can be prevented. Moreover, the flexible display device can include the dispersive structure under the boundary region, and the thickness of the dispersive structure can substantially decrease in the direction from the plane region toward the bending region. Therefore, the stress generated from the display panel can be effectively dispersed, and damage such as crack between the plane region and the bending region can be prevented.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF CERTAIN INVENTIVE EMBODIMENTS

In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Hereinafter, flexible display devices in accordance with example embodiments will be explained in detail with reference to the accompanying drawings.

Figure 1:
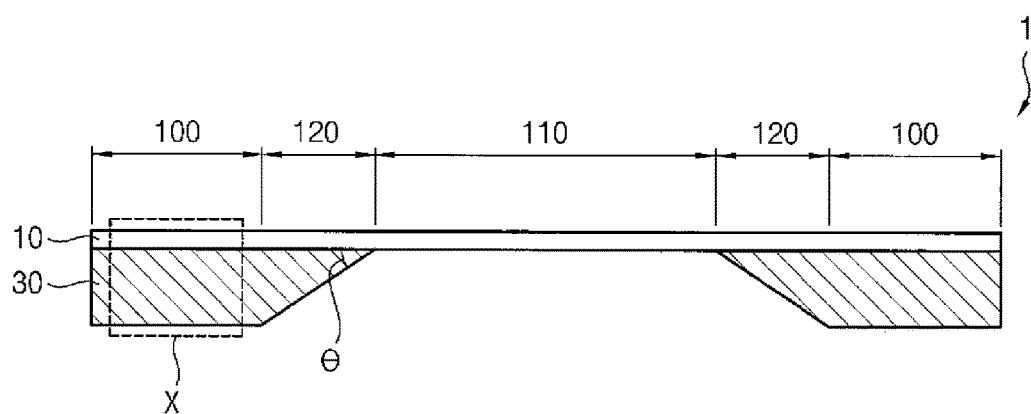
FIG. 1 is a side view illustrating a flexible display device in accordance with example embodiments.
Figure 2:
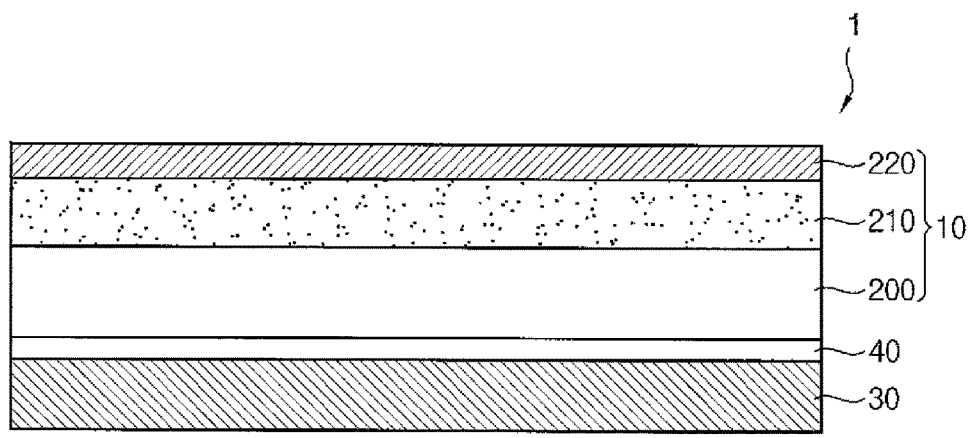
FIG. 2 is a side view illustrating an 'X' portion of the flexible display device in FIG. 1 in accordance with example embodiments.
Figure 3:
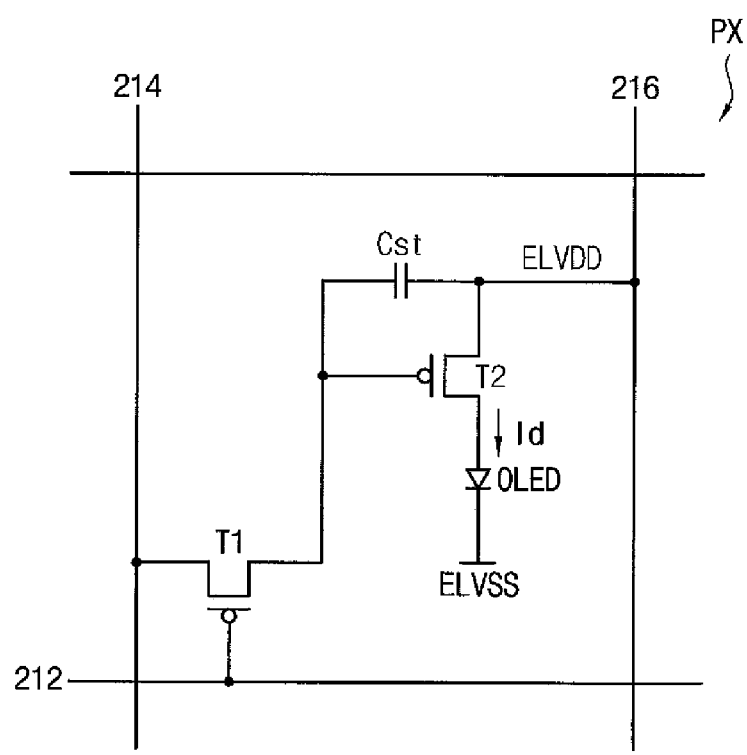
FIG. 3 is a circuit diagram of a pixel of the flexible display device in FIG. 1 in accordance with example embodiments.

FIG. 1 is a side view illustrating a flexible display device in accordance with example embodiments. FIG. 2 is a side view illustrating an 'X' portion of the flexible display device in FIG. 1 in accordance with example embodiments. FIG. 3 is a circuit diagram of a pixel of the flexible display device in FIG. 1 in accordance with example embodiments.

Referring to FIG. 1, the flexible display device 1 includes a display panel 10 that can display images and a protective structure 30 formed under the display panel 10.

In example embodiments, the display panel 10 includes a plane region or flat region 100, a bending region 110, and a boundary region 120. The protective structure 30 can include a first portion formed under the plane region 100 and a second portion formed under the boundary region 120. The plane region 100 can maintain a substantially flat state. In other words, the plane region 100 can be an unbendable or rigid region of the display panel 10. The bending region 110 can correspond to a bendable region or a foldable region of the display panel 10. The protective structure 30 is not formed under the bending region 110. The boundary region 120 is formed between the plane region 100 and the bending region 110. When the display panel 10 is bent, the boundary region 120 can disperse stress generated from an area between the unbendable plane region 100 and the bendable bending region 110.

In example embodiments, the bending region 110 can be located at a center of the display panel 10, and the plane region 100 can be located at a right side and/or a left side of the bending region 110. Here, a center of the flexible display device 1 can be bent; however, a right side part and/or a left side part of the flexible display device 1 may be not bent.

Referring to FIG. 2, the display panel 10 of the flexible display device 1 can be an organic light-emitting diode (OLED) display panel including a flexible substrate 200, an organic light-emitting structure 210, and an encapsulation layer 220. In certain embodiments, the organic light-emitting structure 210 is an OLED. In some example embodiments, the flexible display device 1 can further include an adhesive layer 40 interposed between the display panel 10 and the protective structure 30. Here, the flexible display device 1 can be illustrated as an OLED display device; however, the flexible display device 1 is not limited thereto. The flexible display device 1 can be applied to other flexible display devices such as a liquid crystal display (LCD) device.

The flexible substrate 200 can include flexible material such as polyimide (PI), and the organic light-emitting structure 210 can be formed on the flexible substrate 200.

As illustrated in FIG. 3, the display panel 10 can display images and includes a plurality of pixels PX arranged in a matrix. The display panel 10 includes a plurality of lines 212, 214, 216 electrically connected to the pixel PX to transfer signals to the pixels PX.

The lines 212, 214, 216 include a gate line 212 configured to transfer a gate signal, a data line 214 configured to transfer a data signal, a driving voltage line 216 configured to transfer a first driving voltage ELVDD, etc. The gate line 212 can extend in a row direction on the display panel 10. The data line 214 and the driving voltage line 216 can extend in a column direction on the display panel 10. The data line 214 and the driving voltage line 216 can be arranged to be substantially parallel.

Each pixel PX can include a switching transistor T1, a driving transistor T2, a storage capacitor Cst, the organic light structure 210 or OLED, etc. Here, each pixel PX can include two transistors and one capacitor; however, the pixels PX are not limited thereto. In some example embodiments, each pixel PX can include at least two transistors and at least one capacitor.

The switching transistor T1 can include a first gate electrode, a first source electrode, and a first drain electrode. The first gate electrode can be electrically connected to the gate line 212, the first source electrode can be electrically connected to the data line 214, and the first drain electrode can be electrically connected to the driving transistor T2. The switching transistor T1 can transfer a data signal applied to the data line 214 to the driving transistor T2 based on a gate signal applied to the gate line 212.

The driving transistor T2 can include a second gate electrode, a second source electrode, and a second drain electrode. The second gate electrode can be electrically connected to the switching transistor T1, the second source electrode can be electrically connected to the driving voltage line 216, and the second drain electrode can be electrically connected to the OLED. The driving transistor T2 can supply an output current Id to the OLED based on a voltage applied between the second gate electrode and the second drain electrode of the driving transistor T2.

The storage capacitor Cst can include a first electrode electrically connected the second source electrode of the driving transistor T2 and a second electrode electrically connected to the first drain electrode of the switching transistor T1. The storage capacitor Cst can receive the data signal applied to the second gate electrode of the driving transistor T2 and can store the data signal after the switching transistor T1 is turned-off.

The OLED can include an anode electrically connected to the second drain electrode of the driving transistor T2 and a cathode receiving a second driving voltage ELVSS. The OLED can emit light based on the output current Id transferred from the driving transistor T2 to display images.

Referring to FIG. 2 again, the encapsulation layer 220 can be formed on the organic light-emitting structure 210 (e.g., the OLED). The encapsulation layer 220 can prevent vapor and/or oxygen from entering into the organic light-emitting structure 210 from the environment.

As illustrated in FIGS. 1 and 2, the protective structure 30 can be formed under the flexible substrate 200. The protective structure 30 can protect the flexible substrate 200 from the environment, for example, from being damaged to the contact with other objects including a user of the flexible substrate.

In example embodiments, the protective structure 30 can include polyethylene (PE), polyethylene terephtahlate (PET), polyethylene naphtahlate (PEN), polyethylene sulfide (PES), polypropylene (PP), polycarbonate (PC), etc. These materials may be used alone or in a combination(s) thereof.

In some example embodiments, the adhesive layer 40 is interposed between the flexible substrate 200 and the protective structure 30. The adhesive layer 40 can prevent the protective structure 30 from being detached from the flexible substrate 200 when the flexible display device 1 is bent. The protective structure 30 can be permanently attached to the flexible substrate 200 so that the adhesive layer 40 can have a relatively strong adhesion. For example, the adhesive layer 40 can include an acryl-based resin.

Referring to FIG. 1 again, the protective structure 30 can include a first portion formed under the plane region 100 of the display panel 10 and a second portion formed under the boundary region 120 of the display panel 10. Thus, the protective structure 30 may be not formed under the bending region 110 of the display panel 10. In other words, the protective structure 30 may be not located under the bending region 110 that is bendable so as to reduce stress generated from the display panel 10.

In example embodiments, the thickness of the first portion of the protective structure 30 which is formed under the plane region 100 can be substantially uniform. In other words, the first portion of the protective structure 30 can have substantially the same area as the plane region 100 of the display panel 10, and the thickness of the first portion of the protective structure 30 can be substantially uniform. For example, the thickness of the first portion of the protective structure 30 can be at least about 25 μm. When the thickness of the first portion of the protective structure 30 is less than about 25 μm, the protective structure 30 may not fully protect the display panel 10.

As mentioned above, the first portion of the protective structure 30 which has a substantially uniform thickness can be formed under the plane region 100 of the display panel 10 to protect the display panel 10, and the protective structure 30 may not be formed under the bending region 110 of the display panel 10 to reduce stress. However, the flexible display device 1 can include a stepped section between the plane region 100 and the bending region 110 of the display panel 10. When the display panel 10 is bent, the display panel 10 can be broken at the stepped section, leading to damage such as crack being formed at the display panel or the protective structure 30 can be detached from the display panel 10.

In example embodiments, the thickness of the second portion of the protective structure 30 which is formed under the boundary region 120 of the display panel 10 can decrease along a direction from the plane region 100 toward the bending region 110. In other words, the second portion of the protective structure 30 can have substantially the same area as the boundary region 120 of the display panel 10 and can have a thickness that decreases along the direction from the plane region 100 toward the bending region 110.

In example embodiments, the thickness of the second portion of the protective structure 30 can linearly decrease along the direction from the plane region 100 toward the bending region 110. For example, an angle (θ) between a top surface and a bottom surface of the second portion of the protective structure 30 can be substantially constant. Here, the angle (θ) between the top surface and the bottom surface of the second portion of the protective structure 30 can range between about 0° and about 90°.

When the thickness of the second portion of the protective structure 30 decreases along the direction from the plane region 100 toward the bending region 110, the stress generated from the area between the plane region 100 and the bending region 110 of the display panel 10 can be substantially dispersed around the boundary region 120, so that the display panel 10 can be prevented from being broken or the protective structure 30 can be prevented from being detached from the display panel 10. For example, when the thickness of the second portion of the protective structure 30 substantially linearly decreases along the direction from the plane region 100 toward the bending region 110, the stress generated from the area between the plane region 100 and the bending region 110 of the display panel 10 can be substantially evenly dispersed around the boundary region 120, so that the stress generated from the display panel 10 can be further reduced.

Figure 4:
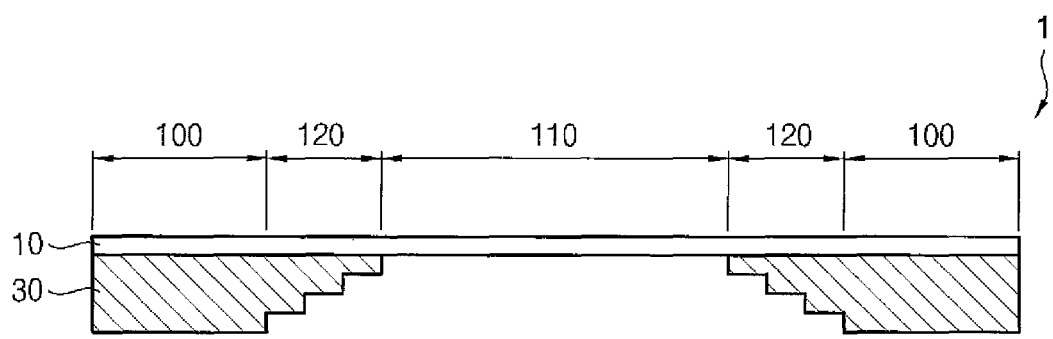
FIGS. 4 and 5 are side views illustrating the flexible display device in accordance with some example embodiments.
Figure 5:
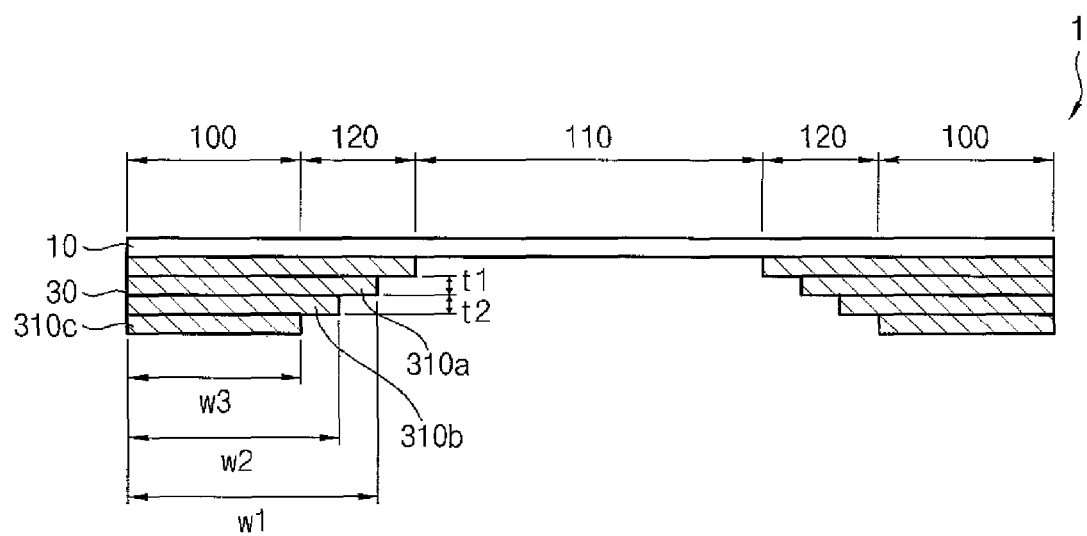

FIGS. 4 and 5 are side views illustrating the flexible display device in accordance with some example embodiments.

Referring to FIGS. 4 and 5, a flexible display device 1 can include a display panel 10 having a plane region 100, a bending region 110 and a boundary region 120, and a protective structure 30 formed under the plane region 100 and the boundary region 120 of the display panel 10. Detailed description(s) of elements in FIGS. 4 and 5 which are substantially the same as or similar to those illustrated with reference to FIGS. 1 to 3 will not be repeated.

In some example embodiments, the thickness of a second portion of the protective structure 30 which is formed under the boundary region 120 of the display panel 10 can decrease in a stepped manner along a direction from the plane region 100 toward the bending region 110. For example, as illustrated in FIG. 4, a plurality of stepped sections are formed under the second portion of the protective structure 30.

In example embodiments, the protective structure 30 including the plurality of stepped sections can have a single layer structure. For example, the plurality of stepped sections can be formed in a substantially stepped manner at the lower surface of the second portion of the protective structure 30, and then the protective structure 30 can be attached to the display panel 10.

In another example embodiments, the protective structure 30 including the plurality of stepped sections can have a structure including a plurality of films 310 which are stacked and have different widths from each other. As illustrated in the embodiment of FIG. 5, a film that is the widest of the plurality of films 310 corresponds to an uppermost layer of the protective structure 30, and films having gradually decreased widths are respectively formed under the film that is the widest. Therefore, the second portion of the protective structure 30 can have the plurality of stepped sections.

In some example embodiments, the thicknesses of the films 310 can be the substantially same. As illustrated in FIG. 5, a first film 310a and a second film 310b can be different films of the plurality of films 310. In this embodiment, the thickness (t1) of the first film 310a and the thickness (t2) of the second film 310b are the substantially same.

In some example embodiments, the widths of the films 310 can sequentially decrease by a substantially equal amount along a direction from the uppermost layer toward a lowermost layer. As illustrated in FIG. 5, the aforementioned first and second films 310a, 310b and a third film 310c can be different films of the plurality of films 310. The first film 310a can be formed on the second film 310b and the third film 310c can be formed under the second film 310b. In this embodiment, the difference (w1−w2) between the width (w1) of the first film 310a and the width (w2) of the second film 310b is substantially the same as the difference (w2−w3) between the width (w2) of the second film 310b and the width (w3) of the third film 310c.

When the thickness of the second portion of the protective structure 30 substantially decreases in the stepped manner along the direction from the plane region 100 toward the bending region 110, the stress generated from an area between the plane region 100 and the bending region 110 of the display panel 10 can substantially disperse to a plurality of points of the boundary region 120 which correspond to a plurality of points at which the stepped sections are located. This can prevent the display panel 10 from being broken or the protective structure 30 from being detached from the display panel 10. For example, when the protective structure 30 includes the plurality of films 310 that have different widths from each other and the widths of the films 310 substantially decrease by a substantially equal amount along the direction from the uppermost layer toward the lowermost layer, the plurality of points at which the stepped sections of the protective structure 30 are located can be substantially evenly distributed within the boundary region 120 of the protective structure 30, so that the stress generated from the display panel 10 can be substantially evenly dispersed within the boundary region 120. Therefore, the stress generated from the display panel 10 can be further reduced.

Figure 6:
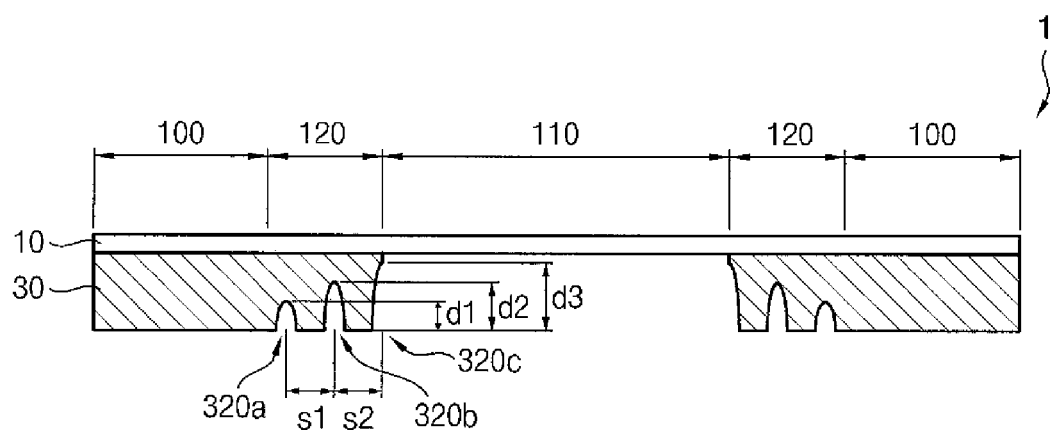
FIG. 6 is a side view illustrating the flexible display device in accordance with some example embodiments.

FIG. 6 is a side view illustrating the flexible display device in accordance with some example embodiments.

Referring to FIG. 6, a flexible display device 1 can include a display panel 10 having a plane region 100, a bending region 110 and a boundary region 120. The flexible display device 1 can further include a protective structure 30 formed under the plane region 100 and the boundary region 120 of the display panel 10. Detailed description(s) of the elements in FIG. 6 which are substantially the same as or similar to those illustrated with reference to FIGS. 1 to 3 will not be repeated.

In some example embodiments, a second portion of the protective structure 30 includes a plurality of holes 320, and the depths of the holes 320 increase along a direction from the plane region 100 toward the bending region 110. Here, the depths of the holes 320 can be defined as the vertical distances between the highest point of each hole 320 and the bottom surface of the protective structure 30. For example, the holes 320 can be formed by a laser etching process.

In example embodiments, the horizontal distances between the holes 320 can be substantially the same as each other. As illustrated in FIG. 6, a first hole 320a, a second hole 320b, and a third hole 320c are be different holes of the plurality of holes 320. The first holes 320a can be formed to the left side of the second hole 320b, and the third hole 320c can be formed to the right side of the second hole 320b. Here, the distance (s1) between the first hole 320a and the second hole 320b can be substantially the same as the distance (s2) between the second hole 320b and the third hole 320c.

In example embodiments, the depths of the holes 320 can increase by a substantially equal amount along the direction from the plane region 100 toward the bending region 110. For example, the difference (d2–d1) between the depth (d2) of the second hole 320b and the depth (d1) of the first hole 320a can be substantially the same as the difference (d3–d2) between the depth (d3) of the third hole 320c and the depth (d2) of the second hole 320a.

As mentioned above, when the second portion of the protective structure 30 includes the plurality of holes 320, stress generated from an area between the plane region 100 and the bending region 110 of the display panel 10 can be dispersed to a plurality of points of the boundary region 120 which correspond to the points at which the holes 320 of the protective structure 30 are formed. This can prevent the display panel 10 from being broken or the protective structure 30 from being detached from the display panel 10. Moreover, when the horizontal distances between the holes 320 are substantially the same as each other, the stress generated in the display panel 10 can be substantially evenly dispersed within the boundary region 120. Therefore, the stress generated from the display panel 10 can be further reduced.

Figure 7:
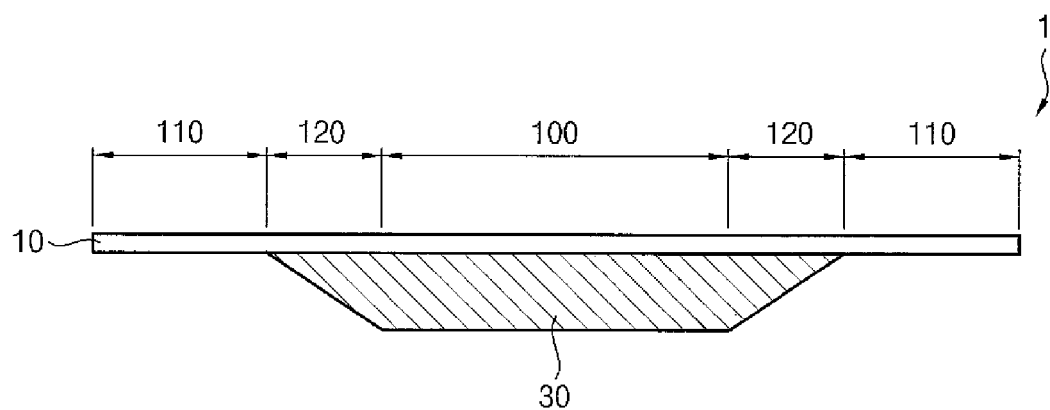
FIG. 7 is a side view illustrating the flexible display device in accordance with some example embodiments.

FIG. 7 is a side view illustrating the flexible display device in accordance with some example embodiments.

Referring to the FIG. 7 embodiment, the flexible display device 1 includes a display panel 10 having a plane region 100, a bending region 110 and a boundary region 120. The flexible display device 1 also include a protective structure 30 formed under the plane region 100 and the boundary region 120 of the display panel 10. Detailed description(s) of elements in FIG. 7 which are substantially the same as or similar to those illustrated with reference to FIGS. 1 to 3 will not be repeated.

In example embodiments, the plane region 100 is located at a center of the display panel 10, and the bending region 110 is located at a right side and/or a left side of the plane region 100. Here, both sides of the flexible display device 1 are bendable, and a center of the flexible display device 1 is not bendable. Although, the thickness of a second portion of the protective structure 30 which is formed under the boundary region 120 can substantially linearly decrease along a direction from the plane region 100 toward the bending region 110 in FIG. 7, the flexible display device 1 is not limited thereto. For example, the flexible display device 1 can include the protective structure 30 in which a plurality of stepped sections are formed under a bottom surface of the second portion of the protective structure 30 or in which a plurality of holes are formed on the second portion of the protective structure 30.

Figure 8:
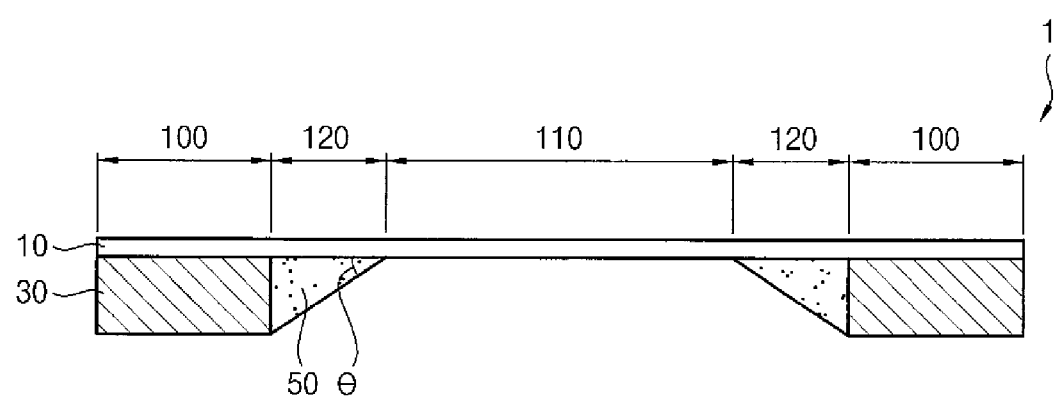
FIG. 8 is a side view illustrating a flexible display device in accordance with example embodiments.

FIG. 8 is a side view illustrating a flexible display device in accordance with example embodiments.

Referring to FIG. 8, the flexible display device 1 includes a display panel 10 having a plane region 100, a bending region 110 and a boundary region 120. The flexible display device 1 also includes a protective structure 30 and a dispersive structure 50. Detailed description(s) of on elements in FIG. 8 which are substantially the same as or similar to those illustrated with reference to FIGS. 1 to 3 will not be repeated.

The protective structure 30 is formed under the plane region 100 of the display panel 10, and the protective structure 30 is not formed under the bending region 110 of the display panel 10. In other words, the protective structure 30 can be removed from under the bending region 110 that is bendable to reduce stress generated from the display panel 10.

The thickness of the protective structure 30 can be substantially uniform. In other words, the thickness of the protective structure 30 can be substantially constant over the protective structure 30. For example, the thickness of the protective structure 30 can be at least about 25 μm. When the thickness of the protective structure 30 is less than about 25 μm, the protective structure 30 may not fully protect the display panel 10.

As mentioned above, the protective structure 30 which has a substantially uniform thickness can be formed under the plane region 100 of the display panel 10 which is unbent to protect the display panel 10, and the protective structure 30 can be removed under the bending region 110 of the display panel 10 which is bendable to reduce stress. However, the flexible display device 1 can include a stepped section between the plane region 100 and the bending region 110 of the display panel 10. When the display panel 10 is bent, the display panel 10 can be broken at the stepped section, leading to damage such as crack(s) being formed in the display panel or the protective structure 30 being detached from the display panel 10.

In example embodiments, the dispersive structure 50 is formed under the boundary region 120 of the display panel 10. For example, the dispersive structure 50 can be formed by spraying a prescribed material along the bottom of the boundary region 120 through a nozzle. Moreover, the dispersive structure 50 can include UV epoxy-based resin, urethane acrylate-based resin, acrylate-based resin, etc. These materials can be used alone or in combination(s) thereof.

The thickness of the dispersive structure 50 can decrease along a direction from the plane region 100 toward the bending region 110.

In example embodiments, the thickness of the dispersive structure 50 can substantially linearly decrease along the direction from the plane region 100 toward the bending region 110. As illustrated in FIG. 8, the thickness of the dispersive structure 50 can substantially constantly decrease along the direction from the plane region 100 toward the bending region 110, and an angle (θ) between a top surface and a bottom surface of the dispersive structure 50 can be substantially constant. Here, the angle (θ) between the top surface and the bottom surface of the dispersive structure 50 can range between about 0° and about 90°.

In example embodiments, when the thickness of the dispersive structure 50 substantially decreases in the direction from the plane region 100 toward the bending region 110, the stress generated from an area between the plane region 100 and the bending region 110 of the display panel 10 can be dispersed within the boundary region 120. So, the display panel 10 can be prevented from being broken or the protective structure 30 from be detached from the display panel 10. Moreover, when the thickness of the dispersive structure 50 substantially linearly decreases in the direction from the plane region 100 toward the bending region 110, the stress generated from the area between the plane region 100 and the bending region 110 of the display panel 10 can be substantially evenly dispersed within the boundary region 120, so that stress generated from the display panel 10 can be further reduced.

Although example embodiments of the flexible display device have been described with reference to the figures, those skilled in the art will readily appreciate that many modifications are possible in the example embodiments without materially departing from the novel teachings and advantages of the described technology.

The described technology can be applied to any electronic device including a flexible display device. For example, the described technology can be applied to display devices for computers, notebooks, cellular phones, smart phones, smart pads, portable media players (PMPs), personal digital assistances (PDAs), MP3 players, digital cameras, video camcorders, etc.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flexible display device, comprising:
   a display panel having a flat region, a bending region, and a boundary region therebetween;
   a first protective structure having a first portion formed under the flat region and a second portion formed under the boundary region,
   wherein the thickness of the first portion is substantially uniform, and
   wherein the thickness of the second portion decreases along a direction from the flat region toward the bending region; and
   a second protective structure having a third portion formed under the flat region and a fourth portion formed under the boundary region,
   wherein the thickness of the third portion is substantially uniform,
   wherein the thickness of the fourth portion decreases along a direction from the flat region toward the bending region, and
   wherein the first protective structure and the second protective structure are spaced apart from each other with a gap therebetween.

2. The flexible display device of claim 1, wherein the thickness of the second portion linearly decreases along the direction from the flat region toward the bending region.

3. The flexible display device of claim 1, wherein the thickness of the second portion decreases in a stepped manner along the direction from the flat region toward the bending region.

4. The flexible display device of claim 1, wherein each of the first and second protective structures includes a plurality of stacked films each having a different width.

5. The flexible display device of claim 4, wherein thicknesses of the films are substantially the same.

6. The flexible display device of claim 4, wherein widths of the films decrease by a substantially equal amount along a direction from an uppermost layer of the films toward a lowermost layer of the films.

7. The flexible display device of claim 1, wherein each of the second portion and the fourth portion includes a plurality of holes and wherein depths of the holes increase along the direction from the flat region toward the bending region.

8. The flexible display device of claim 7, wherein horizontal distances between the holes are substantially the same.

9. The flexible display device of claim 7, wherein the depths of the holes increase by a substantially equal amount along the direction from the flat region toward the bending region.

10. The flexible display device of claim 1, wherein the bending region is located at the center of the display panel and wherein the flat region is located at a side of the bending region.

11. The flexible display device of claim 1, wherein each of the first and second protective structures is formed of at least one of the following materials: polyethylene (PE), polyethylene terephthalate (PET), polyethylene naphthalate (PEN), polyethylene sulfide (PES), polypropylene (PP), and polycarbonate (PC).

12. The flexible display device of claim 1, wherein the display panel includes:
    a flexible substrate formed over the first and second protective structures;
    an organic light-emitting diode (OLED) structure formed over the flexible substrate; and
    an encapsulation layer formed over the OLED.

13. The flexible display device of claim 1, further comprising an adhesive layer interposed between the display panel and the first and second protective structures.

14. The flexible display device of claim 13, wherein the adhesive layer is formed of an acryl-based resin.

15. The flexible display device of claim 1, wherein the gap is formed under the bending region.

16. The flexible display device of claim 15, wherein a surface of the bending region of the display panel is exposed by the gap.

* * * * *